(12) United States Patent
Thomas et al.

(10) Patent No.: US 9,633,865 B2
(45) Date of Patent: Apr. 25, 2017

(54) LOW-STAIN POLISHING COMPOSITION

(75) Inventors: Terence M. Thomas, Newark, DE (US); Hongyu Wang, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 1559 days.

(21) Appl. No.: 12/071,000

(22) Filed: Feb. 22, 2008

(65) Prior Publication Data

US 2009/0215265 A1    Aug. 27, 2009

(51) Int. Cl.
| | |
|---|---|
| C03C 15/00 | (2006.01) |
| C03C 25/68 | (2006.01) |
| H01L 21/302 | (2006.01) |
| H01L 21/461 | (2006.01) |
| C09K 13/00 | (2006.01) |
| C09K 13/02 | (2006.01) |
| H01L 21/321 | (2006.01) |
| C23F 1/32 | (2006.01) |
| C23F 1/14 | (2006.01) |
| C23F 1/00 | (2006.01) |
| H01L 21/306 | (2006.01) |
| H01L 21/304 | (2006.01) |
| C09G 1/02 | (2006.01) |
| C09G 1/04 | (2006.01) |

(52) U.S. Cl.
CPC ............ *H01L 21/3212* (2013.01); *C09G 1/02* (2013.01); *C09G 1/04* (2013.01); *C23F 1/00* (2013.01); *C23F 1/14* (2013.01); *C23F 1/32* (2013.01); *H01L 21/304* (2013.01); *H01L 21/30625* (2013.01)

(58) Field of Classification Search
None
See application file for complete search history.

(56) References Cited

U.S. PATENT DOCUMENTS

| | | | |
|---|---|---|---|
| 7,086,935 B2 * | 8/2006 | Wang | ............................ 451/41 |
| 2005/0233578 A1 * | 10/2005 | Jia et al. | ....................... 438/633 |
| 2006/0610475 | 7/2006 | Ma et al. | |

FOREIGN PATENT DOCUMENTS

| | | |
|---|---|---|
| WO | WO 03/053602 | 7/2003 |
| WO | WO 2004/010121 | 11/2004 |

* cited by examiner

*Primary Examiner* — Stephanie Duclair
(74) *Attorney, Agent, or Firm* — Blake T. Biederman

(57) ABSTRACT

The invention is an aqueous composition useful for chemical mechanical polishing of a patterned semiconductor wafer containing a copper interconnect metal. The aqueous composition includes an oxidizer, an inhibitor for the copper interconnect metal, 0.001 to 15 weight percent of a water soluble modified cellulose, non-saccharide water soluble polymer, 0 to 15 complexing agent for the copper interconnect metal, 0 to 15 weight percent phosphorus compound, 0.05 to 20 weight percent of an acid compound that is capable of complexing copper ions, and water; and the solution has an acidic pH.

5 Claims, No Drawings

LOW-STAIN POLISHING COMPOSITION

BACKGROUND OF THE INVENTION

The invention relates to chemical mechanical polishing (CMP) of semiconductor wafer materials and, more particularly, to CMP compositions and methods for polishing metal interconnects on semiconductor wafers in the presence of dielectrics or barrier materials.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration. However, dishing would continue to be produced for the entire lengthened duration of polishing, thus producing little gain in performance.

U.S. Pat. No. 7,086,935 (Wang) describes the use of an abrasive-free copper formulation containing methyl cellulose, an acrylic acid/methacrylic acid copolymer, benzotriazole (BTA) and miscible solvent for patterned wafers. This formula is capable of removing and clearing copper with low copper dishing, but during rapid polishing, it precipitates a green Cu-BTA compound on the polishing pad and wafer. These precipitates require a post-polishing cleaning of the polishing pad to avoid a decrease in polishing removal rate associated with the gum-like precipitate; and they require a post-polishing cleaning of the wafer with to avoid defect creation. These cleaning steps require strong and costly cleaning solutions and have an associated "cost of ownership" arising from the delayed wafer throughput.

There is a need for polishing compositions that clears copper with low defectivity, low copper dishing, low erosion; and all without the precipitation of Cu-BTA precipitate. Furthermore, there is a desire for these polishing attribute in a low-scratching formulation.

STATEMENT OF THE INVENTION

An aspect of the invention provides an aqueous composition useful for chemical mechanical polishing of a patterned semiconductor wafer containing a copper interconnect metal comprising an oxidizer, an inhibitor for the copper interconnect metal, 0.001 to 15 weight percent of a water soluble modified cellulose, non-saccaride water soluble polymer, 0 to 15 complexing agent for the copper interconnect metal, 0 to 15 weight percent phosphorus compound, 0.05 to 20 weight percent of an acid compound of a formula as follows:

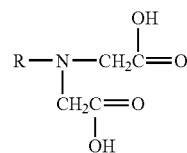

where R is hydrogen or a carbon-containing compound, the acid compound being capable of complexing copper ions, and water; and the solution having an acidic pH.

Another aspect of the invention provides an aqueous composition useful for chemical mechanical polishing of a patterned semiconductor wafer containing a copper interconnect metal comprising 0.5 to 25 weight percent oxidizer, 0.01 to 15 weight percent inhibitor for the copper interconnect metal, 0.005 to 5 weight percent of a water soluble modified cellulose, 0.005 to 5 weight percent non-saccaride water soluble polymer, 0.05 to 10 weight percent phosphorus compound, 0.01 to 15 complexing agent for the copper interconnect metal, 0 to 3 weight percent abrasive, 0.1 to 10 weight percent of an acid compound of a formula as follows:

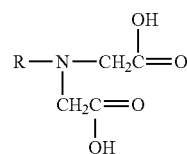

where R is hydrogen or a carbon-containing compound, the acid compound being capable of complexing copper ions, and water; and the solution having an acidic pH.

Another aspect of the invention provides a method for CMP of a semiconductor wafer containing a metal comprising, a) contacting the wafer with a polishing composition, the polishing composition comprising an oxidizer, an inhibitor for the copper interconnect metal, 0.001 to 15 weight percent of a water soluble modified cellulose, non-saccaride water soluble polymer, 0 to 15 complexing agent for the copper interconnect metal, 0 to 15 weight percent phosphorus compound, 0.05 to 10 weight percent of an acid compound of a formula as follows:

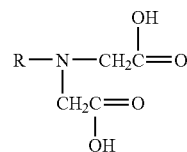

where R is hydrogen or a carbon-containing compound, the acid compound being capable of complexing copper ions, and water, and the solution having an acidic pH; and b) polishing the wafer with a polishing pad.

DETAILED DESCRIPTION

The composition and method provide good metal removal rates, with metal clearing, and low dishing of the metal interconnects when a semiconductor wafer is exposed to CMP and a polishing composition containing an acid compound in combination with a water soluble modified cellulose, a non-saccaride water soluble polymer, an oxidizer, an inhibitor and balance water. The addition of the acid compound provides an additional benefit of lowering the green staining that arises from Cu-BTA (Cu$^{+1}$) precipitate. For purposes of this specification Cu-BTA precipitate includes non-liquids such as solids, gels and polymers and may include Cu+2 ions, spinel precipitates, spinel-like precipitates and impurities. From polishing experience, an insoluble Cu-BTA precipitate forms when the product of copper ion$^{(+1)}$ and BTA concentrations exceed the $K_{sp}$ at its operating temperature. The precipitation of the Cu-BTA appears to occur in acidic polishing solutions following equilibrium expression (1):

Although some amines are effective for dissolving the green "slime-like" precipitate from wafers and polishing pad, particular acid compounds can reduce or eliminate harmful quantities of the Cu-BTA precipitate. In particular, the acid compound has a formulation as follows:

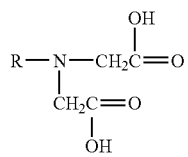

where R is hydrogen or a carbon-containing compound. These acid compounds are capable of complexing copper ions having a single valency (+1) and divalent (+2) copper ions. During polishing, the complexing agent appears to complex sufficient copper ions to reduce the formation of Cu-BTA precipitate and controls the rate of formation of Cu+2 ions in expression (2) as follows:

A concentration of 0.05 to 20 weight percent acid compound can reduce the formation of Cu-BTA precipitate. For example, a range of 0.1 to 10 weight percent acid compound can decrease Cu-BTA precipitate. Advantageously, the formulation has a concentration of at least 0.4 weight percent acid compound, such as 0.4 to 5 weight percent acid compound to control Cu-BTA precipitation. At complexing compound concentrations above about 0.4 weight percent, increasing the complexing compound concentration can increase or accelerate copper removal rate; and at complexing compound concentrations from 0 to about 0.4 weight percent, increasing the complexing compound concentration can decrease copper removal rate. In particular, at least one of iminodiacetic acid ("IDA" or diglycine) and ethylenediaminetetraacetic acid ("EDTA") provide an effective means for reducing Cu-BTA precipitation. IDA appears to represent the most effective complexing agent for reducing Cu-BTA precipitate.

The composition of the present invention utilizes 0.001 to 15 weight percent water soluble cellulose modified with carboxylic acid functionality and water miscible organic solvents such as alcohols and ketones. Preferably, the composition contains 0.005 to 5 weight percent of water soluble cellulose. Most preferably, the composition contains 0.01 to 3 weight percent of water soluble cellulose. Exemplary modified cellulose are anionic gums such as at least one of agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their derivatives and copolymers. The preferred water soluble cellulose, carboxy methyl cellulose (CMC), has a degree of substitution of 0.1 to 3.0 with a weight average molecular weight of 1K to 1000K. For purposes of this specification, molecular weight refers to cellulose in weight average molecular weight. More preferred, the CMC has a degree of substitution of 0.7 to 1.2 with a weight average molecular weight of 40K to 250K. Degree of substitution in CMC is the average number of acetate etherified hydroxyl groups on each anhydroglucose unit in the cellulose molecule. It can be considered as a measure of the "density" of carboxylic acid groups in the CMC.

The non-saccaride water soluble polymers of this invention include acrylic acid polymers, methacrylic polymers and copolymers synthesized utilizing acrylic acid monomer or methacrylic acid monomer. For purposes of this specification, the non-sacaride water soluble polymers also include polymers of various molecular weights and low molecular weight oligomers. Copolymers include those formed from a combination of acrylic acid and methacrylic acid; and in particular, copolymers formed from an acrylic acid to methacrylic acid mole ratio in a range of 1:30 to 30:1; preferably in a range of 1:9 to 9:1; and most preferably about 2:3. The copolymer preferably has a weight average molecular weight in the range of 1K to 1000K; preferably in the range of 10K to 500K.

Alternatively, the non-saccaride water soluble polymer is an amphiphilic polymer, such as a copolymer formed from acrylic acid or metbacrylic acid. The amphiphilic polymers referred to in this specification are block copolymers comprised of a hydrophobic segment and a hydrophilic segment. The hydrophobic segment can be polymeric chains with a carbon number varying from 2 to 250.For purposes of this specification, carbon number represents the number of carbon atoms in the hydrophobic segment. Preferably, the carbon number is 5 to 100 and most preferably 5 to 50. The hydrophilic segment is ionic. The number of monomeric units of the hydrophilic segment preferably varies from 1 to 100. Preferably, the composition contains 0.005 to 5 weight percent non-saccaride water soluble polymers. More preferably, the composition contains 0.01 to 3 weight percent non-saccaride water soluble polymers. Most preferably, the composition contains 0.02 to 2 weight percent of non-saccaride water soluble polymers.

The amphiphilic polymers' preferred number average molecular weight is 50 to 5,000 -this specification refers to amphiphilic polymer in terms of number average molecular weight and specifically by aqueous gel permeation chromatography using TSK-GELpn/08025GIVfPWx and TSK-GELpn/08020 G2500PWx columns in series with a refractive index detector and sodium phosphate buffer eluent. More preferably, the number average molecular weight is between 50 and 4,000 and most preferably the number average molecular weight is between 100 and 3,000. Ionic segments include cationic, anionic, and zwitterions (polyampholytes and polybetaines). Preferably, the hydrophilic segment is anionic such ,as polyacrylic acid or apolymethacrylic acid. The hydrophilic segment preferably contains polyacrylic acid, polymethacrylic acid or a copolymer of acrylic acid and methacrylic acid. The combining of these segments into a copolymer produces molecules with properties different than their respective homopolymers that facilitate clearing without excessive dishing of metal interconnects. The hydrophobic end of the polymer may include hydrocarbon chains or an alkylmercaptan. Most preferably, the hydrophobic and hydrophilic segments combine in the form of a block copolymer.

The solution contains an oxidizer. Preferably, the solution contains 0.5 to 25 weight percent oxidizer. More preferably, the oxidizer is in the range of 1 to 10 weight percent. The oxidizer is particularly effective at assisting the solution in removing copper at low pH ranges. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Furthermore, it is often advantageous to use a mixture of oxidizer compounds. When the polishing slurry contains an unstable oxidizing agent such as, hydrogen peroxide, it is often most advantageous to mix the oxidizer into the composition at the point of use.

Further, the solution contains an inhibitor to control removal of copper interconnect removal rate by static etch or other removal mechanism. Adjusting the concentration of an inhibitor adjusts the interconnect metal removal rate by protecting the metal from static etch. Preferably, the solution contains 0.01 to 15 weight percent inhibitor. Most preferably, the solution contains 0.2 to 1.0 weight percent inhibitor. The inhibitor may consist of a mixture of inhibitors. Azole inhibitors are particularly effective for copper interconnect metals such as pure copper and copper alloys. Experimental testing has indicated that increasing the inhibitor concentration can increase removal rate during polishing. But increasing azole concentration provides the disadvantage of increasing the polishing solution's propensity to precipitate the copper-BTA compound. Typical azole inhibitors include benzotriazole (BTA), mercaptobenzothiazole (MBT), tolytriazole (TTA) and imidazole. Blends of azole inhibitors can increase or decrease copper removal rate. BTA is a particularly effective inhibitor for copper.

In addition to the inhibitor, the composition optionally contains complexing agent for the copper interconnect metal. The complexing agent, such as 0 to 15 weight percent complexing agent, may facilitate the removal rate of the metal film, such as copper. Preferably, the composition contains 0.01 to 15 weight percent copper complexing agent. Most preferably, the composition contains 0.1 to 1 weight percent copper complexing agent. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Preferably, the complexing agent is selected from the group consisting of acetic acid, citric acid, ethyl acetoacetate, glycolic acid, lactic acid, malic acid, oxalic acid and mixtures thereof. Most preferably, the copper complexing agent is malic acid. Malic acid can provide an additional benefit of improving planarization efficiency.

Optionally, the composition includes 0 to 15 phosphorus-containing compound. For purposes of this specification, a "phosphorus-containing" compound is any compound containing a phosphorus atom. A preferred phosphorus-containing compound is, for example, a phosphate, pyrophosphate, polyphosphate, phosphonate, including, their acids, salts, mixed acid salts, esters, partial esters, mixed esters, and mixtures thereof, for example, phosphoric acid. In particular, a preferred aqueous polishing composition can be formulated using, for example, the following phosphorus-containing compounds: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate; iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, including, their acids, salts, mixed acid salts, esters, partial esters, mixed esters, and mixtures thereof. Also, phosphine oxides, phosphine sulphides and phosphorinanes and of phosphonates, phosphites and phosphinates may be used, including, their acids, salts, mixed acid salts, esters, partial esters and mixed esters. A preferred phosphorus-containing compound is ammonium phosphate.

Advantageously, the phosphorus-containing compound of the polishing composition of the present invention is present in an amount effective to increase polishing rates at low down force pressures. It is believed that even a trace amount of the phosphorus-containing compound in the polishing composition is effective for polishing the copper. A satisfactory polishing rate at acceptable polishing down force pressures is obtained by using the phosphorus-containing compound in an amount of about 0.05 to about 10 weight percent of the composition. A preferred range for the phosphorus-containing compound is about 0.1 to about 5 weight percent of the composition. Most preferably, the phosphorus-containing compound is about 0.3 to about 2 weight percent of the composition.

The compounds provide efficacy over a broad pH range in solutions containing a balance of water. Advantageously, the solution has an acidic pH. This solution's useful pH range extends from at least 2 to about 7, such as a value below 7. In addition, the solution preferably relies upon a balance of deionized water to limit incidental impurities. The pH of the polishing fluid of this invention is preferably from 2 to 6, more preferably a pH of 2.5 to 5.5. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

Optionally, alcohols or ketones, in the presence of a modified cellulose compound, provides an acceptable metal removal rate and clearing of the copper metal with low dishing. The composition may contain a non-saccaride water soluble polymer and optionally contains a phosphorus compound. Typically, such water miscible organic solvents are alcohols or ketones, such as at least one of methanol, ethanol, 1-propanol, 2-propanol, ethylene glycol, 1,2-propanediol, glycerol, acetone, and methyl ethyl ketone. Advantageously, the composition contains 0.005 to 10 weight percent of these organic solvents—this specification refers to all compositional ranges in weight percent. Preferably, the composition contains 0.01 to 7.5 weight percent of these organic solvents. Most preferably the composition contains 0.02 to 5 weight percent of these organic solvents.

Further, the polishing composition may optionally contain abrasive, such as, 0 to 3 weight percent abrasive to facilitate metal layer removal. Within this range, it is desirable to have the abrasive present in an amount of less than or equal to 1 weight percent. Most preferably, the polishing compositions are abrasive-free.

The abrasive has an average particle size of less than or equal to 500 nanometers (nm) for preventing excessive metal dishing, dielectric erosion and improving planarization. For purposes of this specification, particle size refers to the average particle size of the abrasive. More preferably, it is desirable to use a colloidal abrasive having an average particle size of less than or equal to 100 nm. Further, decreased dielectric erosion and metal dishing occur with colloidal silica having an average particle size of less than or equal to 70 nm. In addition, the preferred colloidal abrasive may include additives, such as dispersants, surfactants, buffers, and biocides to improve the stability of the colloidal abrasive. One such colloidal abrasive is colloidal silica from Clariant S.A., of Puteaux, France. Also, other abrasives, including, those that are fumed, precipitated, agglomerated, etc., may be utilized.

The polishing composition may include the abrasive for "mechanical" removal of metal interconnect layers. Example abrasives include inorganic oxides, inorganic hydroxides, inorganic hydroxide oxides, metal borides, metal carbides, metal nitrides, polymer particles and mixtures comprising at least one of the foregoing. Suitable inorganic oxides include, for example, silica ($SiO_2$), alumina ($Al_2O_3$), zirconia ($ZrO_2$), ceria ($CeO_2$), manganese oxide ($MnO_2$), titanium oxide ($TiO_2$) or combinations comprising at least one of the foregoing oxides. Suitable inorganic hydroxide oxides include, for example, aluminum hydroxide oxide ("boehmite"). Modified forms of these inorganic oxides, such as, organic polymer-coated inorganic oxide particles and inorganic coated particles may also be utilized if desired. Suitable metal carbides, boride and nitrides include, for example, silicon carbide, silicon nitride, silicon carbonitride (SiCN), boron carbide, tungsten carbide, zirconium carbide, aluminum boride, tantalum carbide, titanium carbide, or combinations comprising at least one of the foregoing metal carbides, boride and nitrides. Diamond may also be utilized as an abrasive if desired. Alternative abrasives also include polymeric particles, coated polymeric particles, and surfactant stabilized particles. The preferred abrasive, if utilized, is silica.

The composition of the present invention is applicable to any semiconductor wafer containing a copper interconnect metal, such as pure copper or a copper alloy. For purposes of the specification, the term dielectric refers to a semiconducting material of dielectric constant, k, which includes low-k and ultra-low k dielectric materials. The composition and method are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The compositions of this invention may also be used for ECMP (Electrochemical Mechanical Polishing).

EXAMPLES

In this Example, all compositions contain, by weight percent, 0.32 carboxymethylcellulose (CMC), 0.1 acrylic acid/methacrylic acid copolymer (2:3 ratio, 23K molecular weight), and 9.00 hydrogen peroxide with a pH adjusted with nitric acid and balance distilled water.

An Applied Materials, Inc. Mirra 200 mm polishing machine equipped with an ISRM detector system using an IC1010™, polyurethane polishing pad (Rohm and Haas Electronic Materials CMP Inc.) under downforce conditions of about 1.5 psi (10.3 kPa), a polishing solution flow rate of 200 cc/min, a platen speed of 93 RPM, and a carrier speed of 87 RPM planarized Cu wafers. A Kinik diamond abrasive disk conditioned the pad. The specific polishing slurry and solutions tested in Examples 1 to 6 contain a base formulation as follows:

0.5 wt % benzotriazole (BTA)
0.22 wt % malic acid
0.32 wt % carboxymethylcellulose (200K molecular weight)
0.1 wt % acrylic acid/methacrylic acid copolymer (2:3 ratio, 23K molecular weight)
9 wt % $H_2O_2$ (Added at polishing)
pH 3.5 (before $H_2O_2$ addition) adjusted with nitric acid
Balance de-ionized water
Note: In the Examples, numerals represent examples of the inventions and letters represent comparative examples.

Example 1

This example screened potential copper complexing agents for use in reducing the formation of green precipitate associated with high-rate copper polishing in the presence of large amounts of BTA. This example tested the base formulation modified to include 1 weight percent phosphate and 0.5 weight percent of multiple complexing agents.

TABLE 1

| Sample | Additive to Base Formulation (0.5 wt %) | Cu Removal Rate (Angstroms per Minute) | Stain Present (?) |
| --- | --- | --- | --- |
| A | None (control) | 4472 | Yes |
| B | Aspartic Acid | 7345 | Yes |
| C | Citric Acid | 2338 | No |
| D | Glutaric Acid | 6899 | Yes |
| E | Lactic Acid | 7194 | Yes |
| F | Maleic Acid | 6612 | Yes |
| G | Malonic Acid | 8327 | Yes |
| H | Nitrilotriacetic Acid | 3196 | No |
| I | Succinic Acid | 6429 | Yes |
| J | Tartaric Acid | 8901 | Yes |
| 1 | $K_2$EDTA | 3791 | No |
| 2 | Iminodiacetic Acid | 4083 | No |

Citric acid, EDTA, nitrilotriacetic acid and iminodiacetic acid all eliminated staining of the polishing pad. But only iminodiacetic acid and EDTA prevented stain formation in combination with sufficient copper removal rate.

Example 2

This Example illustrates the impact of iminodiacetic acid on removal rate and green stain formation to the base formulation with 0.44 weight percent phosphate present.

TABLE 2

| Sample | Concentration of Iminodiacetic Acid (Wt %) | Cu Removal Rate (Angstroms per Minute) | Green Cu-BTA Stain Present (?) |
|---|---|---|---|
| A | None (control) | 4472 | Yes |
| 3 | 0.01 | 4048 | Yes |
| 4 | 0.1 | 3178 | Yes |
| 5 | 0.2 | 3290 | Yes |
| 6 | 0.4 | 3219 | No |
| 7 | 0.44 | 3412 | No |
| 8 | 0.6 | 3615 | No |
| 9 | 0.8 | 3848 | No |
| 10 | 1.0 | 4124 | No |

Examples 3 to 10 all complex with copper to reduce the formation of copper-BTA precipitate. Polishing solutions 6 to 10, however, provided the best combination of copper removal rate and green-stain elimination. Increasing the polishing solution flow rate or adjusting pH to 5 from polishing solution can convert polishing solutions 3 to 5 from polishing solutions that form green precipitate to polishing solutions that do not form green copper-BTA precipitate.

Example 3

This example illustrates the effect of ammonium phosphate and pH on copper dishing and removal rate performance.

TABLE 3

| | Percent IDA (wt %) | Percent Ammonium Phosphate (wt %) | pH | Copper Removal Rate (Å/min) | Dishing 100 × 100 Feature (Å) | Pad Stain (?) |
|---|---|---|---|---|---|---|
| A | 0 (control) | 0.44 | 3.5 | 4664 | 349 | Yes |
| 11 | 0.44 | 1.5 | 3.7 | 4345 | 391 | No |
| 12 | 0.44 | 1.5 | 3.9 | 3882 | 383 | No |
| 13 | 0.44 | 2 | 4.1 | 3538 | 324 | No |
| 14 | 0.4 | 1.5 | 4.1 | 3330 | 332 | Yes |
| 15 | 0.35 | 1.5 | 4.1 | 3282 | 270 | Yes |
| 16 | 0.3 | 1.5 | 4.1 | 3094 | 270 | Yes |
| 17 | 0.25 | 1.5 | 4.1 | 2873 | 258 | Yes |

The increased ammonium phosphate concentrations increased copper removal rate. In addition, increasing the pH decreased copper dishing, but decreased the copper removal rate.

Example 4

The slurry evaluated the base formulation modified to include abrasive particles and 0.44 weight percent ammonium phosphate.

TABLE 4

| Sample | Particle Type | Particle Amount Percent (wt %) | Copper Removal Rate (Å/min) | Step Remaining 100 × 100 Feature (Å) | Pad Stain IDA %/(?) |
|---|---|---|---|---|---|
| A | None | 0 | 5320 | 1247 | 0%/Yes |
| 18 | 50 nm $SiO_2$ | 1 | 6357 | 1092 | 0.44%/No |
| 19 | Sphere $Al_2O_3$ | 0.1 | 5576 | 1245 | 0.44%/No |
| 20 | Flake $Al_2O_3$ | 0.1 | 5828 | 1047 | 0.44%/No |

This Example illustrates that the formulation is suitable for the receipt of abrasive particles. In particular, both silica and alumina particles increased copper removal rate.

Example 5

This example illustrates the impact of malic acid on the base formulation with and without iminodiacetic acid.

TABLE 5

| Sample | Concentration of Malic Acid in Weight Percent | Concentration of Iminodiacetic Acid in Weight Percent | Cu Removal Rate (Angstroms per Minute) | Stain Present (?) |
|---|---|---|---|---|
| A | 0.22 (control) | 0 | 4472 | Yes |
| 21 | 1 | 0 | 3594 | Yes |
| 22 | 1.6 | 0 | 3880 | Yes |
| 23 | 2.2 | 0 | 4132 | Yes |
| 24 | 2.8 | 0 | 4335 | Yes |
| 25 | 0 | 0.44 | 2782 | No |
| 26 | 0.22 | 0.44 | 3412 | No |
| 27 | 0 | 0.6 | 3025 | No |
| 28 | 0 | 1 | 3541 | No |

This example illustrates that malic acid, iminodiacetic acid and a combination of malic acid and iminodiacetic acid increase the copper removal rate. In addition, further testing illustrates that malic acid improves the polishing solution's planarization ability.

Example 6

The following test varied iminodiacetic acid concentration in combination with 1.5 weight percent ammonium phosphate.

TABLE 6

| | Percent IDA | Percent Ammonium Phosphate | pH | Copper Removal Rate (Å/min) | Dishing 100 × 100 Feature (Å) | Pad Stain (?) |
|---|---|---|---|---|---|---|
| A | 0 (control) | 0.44 | 3.5 | 4127 | 353 | Yes |
| 29 | 0.5 | 1.5 | 4.1 | 2731 | 248 | No |
| 30 | 0.6 | 1.5 | 4.1 | 3272 | 354 | No |
| 31 | 0.7 | 1.5 | 4.1 | 3630 | 305 | No |
| 32 | 0.8 | 1.5 | 4.1 | 3841 | 291 | No |
| 33 | 0.9 | 1.5 | 4.1 | 4240 | 344 | No |
| 34 | 1 | 1.5 | 4.1 | 4231 | 282 | No |

Table 6 illustrates that the polishing solutions provide effective stain control in combination with low dishing over a broad iminodiacetic acid range at a pH of 4.1.

Example 7

This example illustrates further benefits that can arise from process factors.

TABLE 7

| Sample | Conditioner | Polishing Pad | Number of Wafers | Stain (?) |
|---|---|---|---|---|
| 35 | Kinik AD3CG181060/ ex situ | IC1010 | 124 | Yes* |
| 36 | Kinik AD3CG181060/ partial in situ | IC1010 | 127 | No |
| 36 | Kinik AD3CG181060/ ex situ | IC1010 | 127 | No |

*Reduced, occurred after several wafers

TABLE 8

| Sample | BTA | Malic Acid | CMC | Copolymer | IDA | NH4H2PO4 | H2O2 | pH |
|---|---|---|---|---|---|---|---|---|
| 35 | 0.50 | 0.22 | 0.32 | 0.10 | 0.44 | 2.00 | 9.00 | 4.10 |
| 36 | 0.3 | 0.22 | 0.32 | 0.1 | 1 | 1.5 | 9 | 4.1 |

These data illustrate that in situ conditioning can further decrease a polishing pad's ability to retain the detrimental copper-BTA precipitate. These process factors can reduce the amount of iminodiacetic acid necessary for effective control of the copper-BTA precipitate. A particular example of an effective formulation is as follows: 0.3 wt % BTA, 0.22 wt % malic acid, 0.32 wt % CMC, 0.1 wt % acrylic acid/methacrylic acid copolymer (2:3 ratio, 23K molecular weight), 1 wt % iminodiacetic acid, 1.5 wt % ammonium dihydrogen phosphate $NH_4H_2PO_4$ and 9 wt % $H_2O_2$ (added immediately before polishing) at a pH of 4.1 measured before $H_2O_2$ addition.

The invention claimed is:

1. An aqueous composition useful, for chemical mechanical polishing of a patterned semiconductor wafer containing a copper interconnect metal comprising an oxidizer, 0.01 to 15 weight percent benzotriazole inhibitor for the copper interconnect metal, 0.001 to 15 weight percent of a water soluble modified cellulose, 0.005 to 5 weight percent non-saccaride water soluble polymer, the non-saccaride polymer selected from at least one of copolymers formed from acrylic acid monomer and methacrylic acid monomer and amphiphilic polymers, the amphiphilic polymer being a block copolymer comprised of hydrophobic and hydrophilic segments, 0 to 15 weight percent complexing agent for the copper interconnect metal, 0 to 15 weight percent phosphorus compound, 0.4 to 5 weight percent diglycine, the diglycine being capable of complexing copper ions, and water; and the composition being abrasive-free and having an acidic pH.

2. The composition of claim 1 wherein the water soluble modified cellulose is modified with a carboxylic acid functionality selected from at least one of carboxy methyl cellulose, agar gum, arabic gum, ghatti gum, karaya gum, guar gum, pectin, locust bean gum, tragacantb gums, tamarind gum, carrageenan gum, and xantham gum, modified starch, alginic acid, mannuronic acid, guluronic acid, and their derivatives and copolymers.

3. The composition of claim 2 wherein the water soluble modified cellulose is carboxy methyl cellulose.

4. An aqueous composition useful for chemical mechanical polishing of a patterned semiconductor wafer containing a copper interconnect metal comprising 0.5 to 25 weight percent oxidizer, 0.01 to 15 weight percent benzotriazole inhibitor for the copper interconnect metal, 0.005 to 5 weight percent of a water soluble modified cellulose, 0.005 to 5 weight percent non-saccaride water soluble polymer, the non-saccaride polymer selected from at least one of copolymers formed from acrylic acid monomer and methacrylic acid monomer and amphiphilic polymers, the amphiphilic polymer being a block copolymer comprised of hydrophobic and hydrophilic segments, 0.05 to 10 weight percent phosphorus compound, 0.01 to 15 weight percent complexing agent for the copper interconnect metal, 0.4 to 5 weight percent diglycine, the diglycine being capable of complexing copper ions, and water; and the composition being abrasive-free and having an acidic pH.

5. A method for CMP of a semiconductor wafer containing a metal comprising, a) contacting the wafer with a polishing composition, the polishing composition comprising an oxidizer, 0.01 to 15 weight percent benzotriazole inhibitor for the copper interconnect metal, 0.001 to 15 weight percent of a water soluble modified cellulose, 0.005 to 5 weight percent non-saccaride water soluble polymer, the non-saccaride polymer selected from at least one of copolymers formed from acrylic acid monomer and methacrylic acid monomer and amphiphilic polymers, the amphiphilic polymer being a block copolymer, comprised of hydrophobic and hydrophilic segments, 0 to 15 weight percent complexing agent for the copper interconnect metal, 0 to 15 weight percent phosphorus compound, 0.4 to 5 weight percent diglycine, the diglycine compound being capable of complexing copper ions, and water, and the composition being abrasive-free and having an acidic pH; and b) polishing the wafer with a polishing pad.

* * * * *